(12) United States Patent
Guo et al.

(10) Patent No.: US 12,112,797 B1
(45) Date of Patent: Oct. 8, 2024

(54) CROSS-LAYER RECONFIGURABLE STATIC RANDOM ACCESS MEMORY (SRAM) BASED COMPUTE-IN-MEMORY MACRO AND METHOD FOR EDGE INTELLIGENCE

(71) Applicant: Shanghai Jiao Tong University, Shanghai (CN)

(72) Inventors: Xinfei Guo, Shanghai (CN); Runxi Wang, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 0 days.

(21) Appl. No.: 18/602,078

(22) Filed: Mar. 12, 2024

(30) Foreign Application Priority Data

Jun. 13, 2023 (CN) .......................... 202310700487.3

(51) Int. Cl.
| | | |
|---|---|---|
| G11C 11/00 | (2006.01) |
| G06F 7/505 | (2006.01) |
| G06F 7/544 | (2006.01) |
| G11C 11/419 | (2006.01) |

(52) U.S. Cl.
CPC ............ *G11C 11/419* (2013.01); *G06F 7/505* (2013.01); *G06F 7/5443* (2013.01)

(58) Field of Classification Search
CPC ..... G11C 7/1009; G11C 7/1057; G11C 7/106; G11C 7/1087; G11C 7/109; G11C 7/1096; G11C 7/12; G11C 8/12; G11C 5/025; G11C 8/10; G11C 8/16; G11C 11/418; G11C 11/419; G11C 7/1006
See application file for complete search history.

(56) References Cited

U.S. PATENT DOCUMENTS

| | | | |
|---|---|---|---|
| 11,372,622 B2* | 6/2022 | Srivastava | H10B 10/12 |
| 11,599,600 B2* | 3/2023 | Lin | G11C 11/54 |
| 2021/0117156 A1* | 4/2021 | Ali | G06F 7/74 |
| 2024/0071439 A1* | 2/2024 | Rawat | G11C 8/16 |

FOREIGN PATENT DOCUMENTS

| | | | | |
|---|---|---|---|---|
| CN | 114446350 A | * | 5/2022 | |
| CN | 115588446 A | * | 1/2023 | |
| CN | 115810374 A | * | 3/2023 | |

* cited by examiner

Primary Examiner — Hien N Nguyen

(57) ABSTRACT

The present disclosure provides a cross-layer reconfigurable static random access memory (SRAM) based compute-in-memory (CIM) macro and method for edge intelligence. The cell includes a SRAM cell and a column-shared reconfigurable Boolean computation cell. A reconfiguration computation is performed based on the SRAM cell to obtain a reconfigured structure; the column-shared reconfigurable Boolean computation cell outputs a computation result based on the reconfigured structure; and a peripheral computation circuit supporting pipelined bit-serial addition outputs an in-memory addition result on a basis of a Boolean computation. In order to meet a requirement of edge artificial intelligence (AI) for a low power consumption and a low hardware overhead, and to enable an accelerator to adapt to a fast iterative software algorithm as much as possible.

20 Claims, 5 Drawing Sheets

| Operation | Input | Q | RWL_PX | RWL_NX | RBL_X |
|---|---|---|---|---|---|
| Read | - | 0 | 0 | 0 | - |
|  | - | 1 | 0 | 0 | - |
| AND | 0 | 0 | 0 | 0 | 0 |
|  | 0 | 1 | 0 | 0 | 0 |
|  | 1 | 0 | 0 | 1 | 0 |
|  | 1 | 1 | 0 | 1 | 1 |
| OR | 0 | 0 | 0 | 1 | 0 |
|  | 0 | 1 | 0 | 1 | 1 |
|  | 1 | 0 | 1 | 1 | 1 |
|  | 1 | 1 | 1 | 1 | 1 |
| XOR | 0 | 0 | 0 | 1 | 0 |
|  | 0 | 1 | 0 | 1 | 1 |
|  | 1 | 0 | 1 | 0 | 1 |
|  | 1 | 1 | 1 | 0 | 0 |

FIG. 2

CROSS-LAYER RECONFIGURABLE STATIC RANDOM ACCESS MEMORY (SRAM) BASED COMPUTE-IN-MEMORY MACRO AND METHOD FOR EDGE INTELLIGENCE

CROSS REFERENCE TO RELATED APPLICATION

This patent application claims the benefit and priority of Chinese Patent Application No. 2023107004873, filed with the China National Intellectual Property Administration on Jun. 13, 2023, the disclosure of which is incorporated by reference herein in its entirety as part of the present application.

TECHNICAL FIELD

The present disclosure relates to the technical field of compute-in-memory (CIM), and specifically, to a cross-layer reconfigurable static random access memory (SRAM) based CIM macro and method for edge intelligence.

BACKGROUND

Based on a hardware level, works similar to digital computing-in-memory (CIM) involve three levels: a static random access memory (SRAM) cell level, a SRAM array and peripheral circuit level, and an architecture and system level.

At the SRAM cell level, works [2] and [3] respectively design 12T and 10T SRAM computation cells for Boolean computations, but directly adding computational logic to the SRAM cell can result in a significant additional area overhead. In some designs, the computational logic is stacked on the peripheral circuit of the SRAM array to perform a Boolean or arithmetic computation. For example, in the work [1], two peripheral circuits are proposed: a bit-serial computing peripheral circuit and a bit-parallel computing peripheral circuit, which are respectively used for a vector computation accelerator with a high data throughput and a vector computation accelerator with a low computation latency to process data read from the SRAM array. This work has a significant advantage in reducing the additional area overhead by concentrating the computational logic on the peripheral circuit of the SRAM array, but ultimately fails to achieve reconfigurability between the two peripheral circuits for different types of models or algorithms, and also fails to fully utilize a Boolean computation that can be implemented within the SRAM cell to reduce a gate circuit overhead in a peripheral computation circuit. At the architecture and system level, work [4] proposes a cache accelerator supporting large-scale parallel computations, which covering a general arithmetic computation and a layer operator in a neural network. However, this work also adopts an 8T SRAM cell, which results in a greater area overhead. In addition, the peripheral computation circuit supports fixed computation functions, and can also support more different computational accuracies and operators through optimization.

Recently, there have also been some reconfigurable CIM designs. Most designs mainly focus on adjustable computational precision, such as works [5], [6], and [7]. Some works such as [8] and [9] include a reconfigurable kernel size to facilitate adaptation of various neural networks. There is also more fine-grained reconfigurability. For example, in work [8], reconfigurability of a bitwise Boolean operation is added. Work introduces a configuration module for switching between different computation modes. Work proposes an architecture similar to a field-programmable gate array (FPGA) structure at the system level to achieve the reconfigurability.

The Chinese patent with a publication number "CN115083462A" discloses a SRAM-based digital CIM device. The digital CIM device includes a SRAM weight array module, an input port, an AND gate array module, a counting array module, and a digital weighing configuration module. The SRAM weight array module is configured to store a computation weight. The input port is configured to obtain input data. The AND gate array module is configured to obtain a computation result based on the computation weight and the input data. The counting array module performs a counting operation on the computation result to obtain a counting result. The digital weighing configuration module is configured to generate a final computation result based on the counting result.

[1] K. Al-Hawaj, O. Afuye, S. Agwa, A. Apsel, and C. Batten, "Towards are configurable bit-serial/bit-parallel vector accelerator using in-situ processing-in-SRAM," in 2020IEEE International Symposium on Circuits and Systems (ISCAS). IEEE, 2020, pp. 1-5.

[2] S. Yin, Z. Jiang, J.-S. Seo, and M. Seok, "Xnor-SRAM: In-memory computing SRAM macro for binary/ternary deep neural networks," IEEE Journal of Solid-State Circuits, vol. 55, no. 6, pp. 1733-1743, 2020.

[3] H. Zhang, L. Jiang, J. Wu, T. Chen, J. Liu, W. Kang, and W. Zhao, "Cp-SRAM: charge-pulsation SRAM marco for ultra-high energy-efficiency computing-in-memory," in Proceedings of the 59th ACM/IEEE Design Automation Conference, 2022, pp. 109-114.

[4] [15] C. Eckert, X. Wang, J. Wang, A. Subramaniyan, R. Iyer, D. Sylvester, D. Blaauw, and R. Das, "Neural cache: Bit-serial in-cache acceleration of deep neural networks," in 2018ACM/IEEE 45Th annual international symposium on computer architecture (ISCA). IEEE, 2018, pp. 383-396.

[5] [6] F. Tu, Y. Wang, Z. Wu, L. Liang, Y. Ding, B. Kim, L. Liu, S. Wei, Y. Xie, and S. Yin, "A 28 nm 29.2tflops/w bf16 and 36.5tops/w int8 reconfigurable digitalcim processor with unified fp/int pipeline and bitwise in-memory booth multiplication for cloud deep learning acceleration," in 2022IEEE International Solid-State Circuits Conference (ISSCC), vol. 65. IEEE, 2022, pp. 1-3.

[6] [10] H. Kim, T. Yoo, T. T.-H. Kim, and B. Kim, "Colonnade: A reconfigurable SRAM-based digital bit-serial compute-in-memory macro for processing neural networks," IEEE Journal of Solid-State Circuits, vol. 56, no. 7, pp. 2221-2233, 2021.

[7] [16] K. Lee, J. Jeong, S. Cheon, W. Choi, and J. Park, "Bit parallel 6t SRAM in-memory computing with reconfigurable bit-precision," in 2020 57th ACM/IEEE Design Automation Conference (DAC). IEEE, 2020, pp. 1-6.

[8] [17] B. Yan, J.-L. Hsu, P.-C. Yu, C.-C. Lee, Y. Zhang, W. Yuc, G. Mei, Y. Yang, Y. Yang, H. Li et al., "A 1.041-mb/mm 2 27.38-tops/w signed int8 dynamic-logic-based adc-less SRAM compute-in-memory macro in 28 nm with reconfigurable bitwise operation for ai and embedded applications," in 2022IEEE International Solid-State Circuits Conference (ISSCC), vol. 65. IEEE, 2022, pp. 188-190.

[9] [18] Y.-H. Lin, C. Liu, C.-L. Hu, K.-Y. Chang, J.-Y. Chen, and S.-J Jou, "Are configurable in-SRAM computing architecture for dcnn applications," in 2021 International Symposium on VLSI Design, Automation and Test (VLSI-DAT). IEEE, 2021, pp. 1-2.

[10] [20] M. Kang, S. K. Gonugondla, A. Patil, and N. R. Shanbhag, "A multifunctional in-memory inference processor using a standard 6t SRAM array," IEEE Journal of Solid-State Circuits, vol. 53, no. 2, pp. 642-655, 2018.

[11] [21] R. Gauchi, V. Egloff, M. Kooli, J.-P. Nocl, B. Giraud, P. Vivet, S. Mitra, and H.-P. Charles, "Reconfigurable tiles of computing-in-memory SRAM architecture for scalable vectorization," in Proceedings of the ACM/IEEE International Symposium on Low Power Electronics and Design, 2020, pp. 121-126.

Regarding the relevant technologies mentioned above, the inventor deems that the aforementioned works are relatively simple in exploration of the reconfigurability. However, with the rapid iteration and diversification of algorithms in recent years, the CIM needs to have greater reconfigurable space for accelerating an edge neural network, that is, it is difficult to reconfigure computational precision, a kernel size dimension of a neural network layer, a model size, and even other common non-intelligent algorithms at an edge.

SUMMARY

To overcome the drawbacks in the prior art, the present disclosure is intended to provide a cross-layer reconfigurable SRAM based CIM macro and method for edge intelligence.

A cross-layer reconfigurable SRAM based CIM macro for edge intelligence provided according to the present disclosure includes a SRAM cell and a column-shared reconfigurable Boolean computation cell, and is configured to perform a reconfiguration computation based on the SRAM cell to obtain a reconfigured structure; and output, by the column-shared reconfigurable Boolean computation cell, a computation result based on the reconfigured structure.

the SRAM cell has six transistors and separates a wordline (WL) to obtain a wordline X (WLX) and a wordline Y (WLY);

the WLX controls a bitline (BL) to perform reading and writing on the corresponding SRAM cell;

the WLY controls a bitline bar (BLB) to perform reading and writing on the corresponding SRAM cell;

a plurality of additional transistors connected to a BL and a BLB in each column are column-shared reconfigurable Boolean computation cells;

voltage levels of a read wordline PX (RWL_PX) and a read wordline NX (RWL_NX) depend on a mode of a to-be-performed Boolean computation for the BL and an externally input value;

voltage levels of a read wordline PY (RWL_PY) and a read wordline NY (RWL_NY) depend on the mode of the to-be-performed Boolean computation for the BLB and the externally input value; and the computation result obtained by the column-shared reconfigurable Boolean computation cell is separately output through a read bitline X (RBL_X) and a read bitline Y (RBL_Y).

Preferably, the column-shared reconfigurable Boolean computation cell supports read, write, AND, OR, and XOR modes; and the column-shared reconfigurable Boolean computation cell is configured by a value of decoded input data and a specific computing mode coming along with RWLs, and computed results are generated in RBLs.

Preferably, on a basis of establishing a SRAM array, CIM supporting pipelined bit-serial addition is established; and in a CIM establishment process, additional computational logic is added to a peripheral circuit of the SRAM array.

Preferably, if a number currently stored in the array is Q, when the number Q and an externally input number IN need to be added up, a carry value of an $i^{th}$ bit and a sum value of an $(i+1)^{th}$ bit are computed simultaneously; a value of $Q_{i+1}$ is read from the BL and a value of $Q_i'$ is read from the BLB, where the $Q_i'$ represents an inverse value of $Q_i$, and the $Q_i$ represents an $i^{th}$ value in a binary expression sequence of the number Q;

a column-shared reconfigurable Boolean computation cell connected to the BL performs an XOR computation on a value of the BL and a corresponding decoded external input $IN_i$, and a column-shared reconfigurable Boolean computation cell connected to the BLB uses a value of the BLB and a corresponding decoded external input $IN_{i+1}$ to obtain a Boolean AND result, where the $IN_i$ represents an $i^{th}$ value in a binary expression sequence of the externally input number IN; and a Boolean AND result read from an RBL is input into a pipelined addition peripheral computation circuit, and subsequent computational logic is completed.

Preferably, a multiply-accumulate (MAC) operation is established on pipelined bit-parallel addition;

an input and a weight of each layer of a neural network are stored in a slice of the SRAM array in different ways;

each array has limited storage space and is adjusted based on precision and kernel size requirements during linking; and in a MAC operation process, a logic part of the pipelined bit-parallel addition in the peripheral circuit is reused for a shift-and-add multiplication algorithm.

A cross-layer reconfigurable SRAM based CIM method for edge intelligence provided according to the present disclosure is applied to a cross-layer reconfigurable SRAM based CIM macro for edge intelligence, and includes following steps:

reconfiguration step: performing a reconfiguration computation based on a SRAM cell to obtain a reconfigured structure; and computation step: outputting, by a column-shared reconfigurable Boolean computation cell, a computation result based on the reconfigured structure.

Preferably, in the computation step, the SRAM cell separates a WL to obtain a WLX and a WLY;

the WLX controls a BL to perform reading and writing on the corresponding SRAM cell;

the WLY controls a BLB to perform reading and writing on the corresponding SRAM cell;

voltage levels of an RWL_PX and an RWL_NX depend on a mode of a to-be-performed Boolean computation for the BL and an externally input value;

voltage levels of an RWL_PY and an RWL_NY depend on the mode of the to-be-performed Boolean computation for the BLB and the externally input value; and the computation result obtained by the column-shared reconfigurable Boolean computation cell is separately output through an RBL_X and an RBL_Y.

Preferably, in the reconfiguration step, on a basis of establishing a SRAM array, CIM supporting pipelined bit-parallel addition is established, and additional computational logic is added to a peripheral circuit of the SRAM array.

Preferably, in the computation step, if a number currently stored in the array is Q, when the number Q and an externally input number IN need to be added up, a carry value of an $i^{th}$ bit and a sum value of an $(i+1)^{th}$ bit are computed simultaneously; a value of $Q_{i+1}$ is read from the BL and a value of $Q_i'$ is read from the BLB, where the $Q_i'$ represents an inverse value of $Q_i$, and the $Q_i$ represents an $i^{th}$ value in a binary expression sequence of the number Q;

a column-shared reconfigurable Boolean computation cell connected to the BL performs an XOR computation on a value of the BL and a corresponding decoded external input $IN_i$, and a column-shared reconfigurable Boolean computation cell connected to the BLB uses a value of the BLB and a corresponding decoded external input $IN_{i+1}$ to obtain a Boolean AND result, where the $IN_i$ represents an $i^{th}$ value in a binary expression sequence of the externally input number IN; and a Boolean AND result read from an RBL is input into a pipelined addition peripheral computation circuit, and subsequent computational logic is completed.

Compared with the prior art, the present disclosure has following beneficial effects:

1. In order to meet a requirement of edge artificial intelligence (AI) for a low power consumption and a low hardware overhead, and to enable an accelerator to adapt to a fast iterative software algorithm as much as possible, the present disclosure proposes a novel SRAM-based CIM macro that can be configured across hardware layers to support a plurality of Boolean, arithmetic, and macro operations, thereby achieving a better balance between reconfigurability and an additional overhead.

2. The bit-serial addition scheme in the present disclosure has a lower delay than previous work [1]. If this computation mode is activated simultaneously in all columns, an overall data throughput can be improved.

3. A peripheral computation circuit supporting the pipelined bit-parallel addition in the present disclosure has higher reusability and flexibility. The MAC operation based on the addition operation can repeatedly utilize this circuit for an operation to reduce a hardware overhead.

BRIEF DESCRIPTION OF THE DRAWINGS

Other features, objectives, and advantages of the present disclosure will become more apparent by reading the detailed description of non-limiting embodiments with reference to the following accompanying drawings.

FIG. 2 is a schematic diagram of logical mappings of an RWL and an RBL of a column-shared reconfigurable Boolean computation cell;

DETAILED DESCRIPTION OF THE EMBODIMENTS

The present disclosure is described in detail below with reference to specific embodiments. The following embodiments will help those skilled in the art to further understand the present disclosure, but do not limit the present disclosure in any way. It should be noted that several variations and improvements can also be made by a person of ordinary skill in the art without departing from the conception of the present disclosure. These all fall within the protection scope of the present disclosure.

Figure 1:
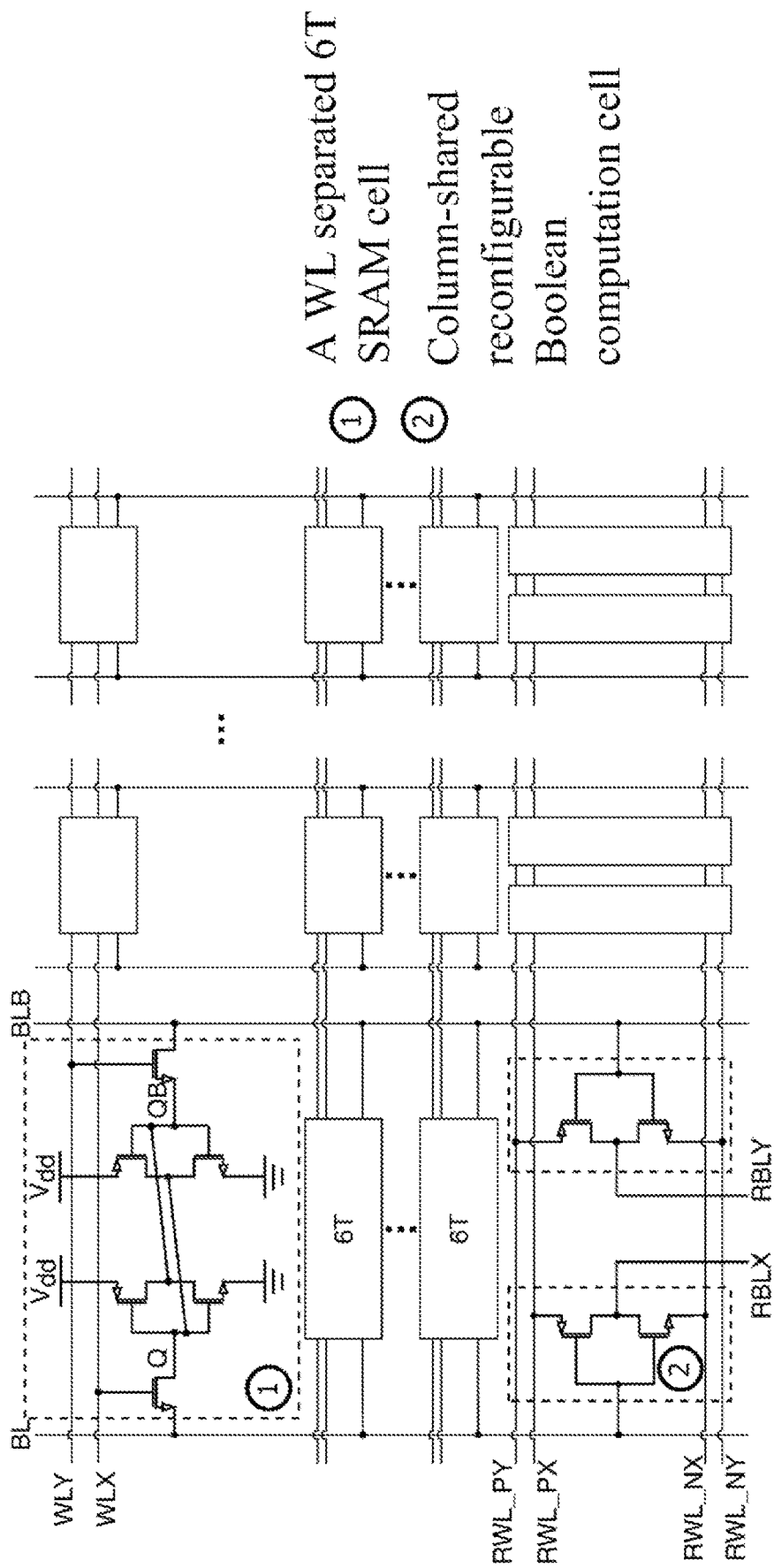
FIG. 1 is a schematic diagram of a 6T WL separated SRAM array and a column-shared reconfigurable Boolean computation cell.

An embodiment of the present disclosure provides a cross-layer reconfigurable SRAM based CIM macro for edge intelligence, as shown in FIG. 1 and FIG. 2. A reconfigurable computation design based on a SRAM cell is first proposed (as shown in FIG. 1). Unlike a traditional SRAM cell, the SRAM cell in the present disclosure has six basic transistors (6T) and separates a WL to obtain a WLX and a WLY, which respectively control two BLs (BL and BLB) to perform reading and writing on the corresponding SRAM cell. Four additional transistors connected to a BL and a BLB in each column are "column-shared reconfigurable Boolean computation cells". For the BL, a computation mode and an externally input value can be determined by controlling voltage levels an RWL_PX and an RWL_NX. For the BLB, configuration can be performed by controlling voltage levels an RWL_PY and an RWL_NY. A computation result obtained by the column-shared reconfigurable Boolean computation cell is separately output by an RBL_X and an RBL_Y. The column-shared reconfigurable Boolean computation cell can support read, write, AND, OR, and XOR modes. To configure the five modes, reference may be made to logical mappings of an RWL and an RBL in FIG. 2 to decode input data and a computation mode, thereby obtaining an ideal computation result. In FIG. 1, VDD represents a supply voltage value, Q represents a value stored in a current SRAM cell, and QB represents an inverse value of the value stored in the current SRAM cell. In FIG. 2, Operation represents an operation mode, Read represents read data, and Input represents an input value.

Figure 3:
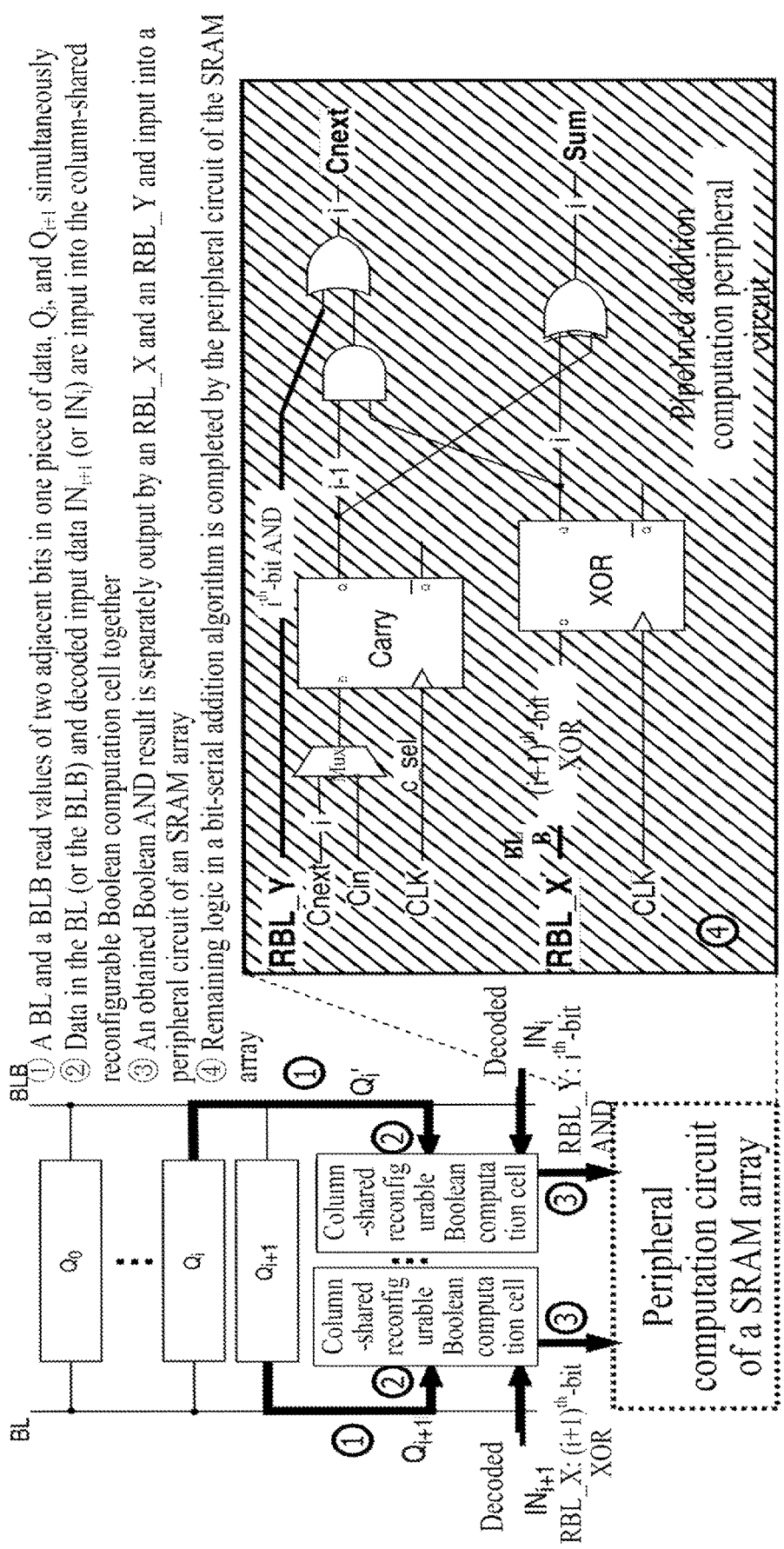
FIG. 3 is a schematic diagram of an addition-specific SRAM array with a peripheral computation circuit.

On a basis of the foregoing SRAM array design, the present disclosure also proposes a CIM design supporting pipelined bit-parallel addition. A core of the design is to add additional computational logic to a peripheral circuit of a SRAM array (as shown in FIG. 3). It is assumed that a number currently stored in the array is Q, and its binary expression sequence is $Q_0, Q_1, \ldots, Q_n$. When it is necessary to add up the number and an externally input number (which is set to IN whose binary sequence expression is similar to that of the Q), in other words, when it is necessary to add up a number stored in the array and the externally input number, assuming that a carry value of an $i^{th}$ bit is computed, a value of $Q_{i+1}$ and a value of $Q_i'$ are respectively read from the BL and the BLB simultaneously. Column-shared reconfigurable Boolean computation cells connected to the BL and the BLB perform XOR and AND computations on these two values and their corresponding external inputs ($IN_i$ and $IN_{i+1}$) respectively. A Boolean AND result read from the RBL is input into a pipelined addition peripheral computation circuit, and subsequent computational logic is completed. This method divides bit-serial addition into two stages and shortens total computation time through pipelined improvement. This method also utilizes a characteristic that a Boolean computation can be performed for each value in a same column in the SRAM array simultaneously. The $IN_i$ represents an $i^{th}$ value in the binary expression sequence of the externally input number IN; the $Q_i'$ represents an inverse value of $Q_i$; and the $Q_i$ represents an $i^{th}$ value in the binary expression sequence of the number Q. In FIG. 3, Cnext represents a carry value port, Sum represents a sum value port, Cin represents a carry value of an external setting/input, c_sel represents a carry value selection signal, Mux represents a selector, and CLK represents a clock signal. Each other i or i+1 represents an intermediate result of the $i^{th}$ bit or an $(i-1)^{th}$ bit.

An important operator in a neural network algorithm, namely, MAC, can also be completed based on the above design. This operation can be decomposed into multiplication and addition. In addition, the multiplication itself can be seen as a series of addition operations that depend on a quantity of digits of a multiplier. Therefore, the MAC can be established on pipelined bit-parallel addition. An input and a weight of each layer of a neural network can be stored in a slice of the SRAM array in different ways. Each array has a 4 KB storage capacity and can be connected when necessary to accommodate more weight values to meet different precision or kernel size requirements. A SRAM array used for kernel storage may have no column-shared Boolean computation cell to reduce an additional area overhead. In a MAC operation process, a logic part of the pipelined bit-parallel addition in the peripheral circuit is reused to implement a "shift-and-add" multiplication algorithm. In addition, in order to maintain a high computation frequency, a process of loading data from a chip memory and a computation process are carried out simultaneously.

The present disclosure is a SRAM-based digital CIM design. In order to evaluate the above design, the present disclosure uses a standard TSMC28 nm process in the industry and software Cadence Virtuoso for simulation. A voltage used for the simulation is 0.9 V. For a Boolean operation at a SRAM cell level, the two RWLs (the RWL_PX and the RWL_NX) need to be set based on the computation mode and the external input that are listed in FIG. 2. A simulation result shows that all results output from the RBL are within a distinguishable level range and have correct functionality. For reconfigurability of the SRAM array in the Boolean computation, a composite test is provided in FIG. 5, and all Boolean operation modes are used in a use case. Starting from 20 nanoseconds, the RWL_PX and the RWL_NX are configured to execute the AND, OR, and XOR modes. The computation mode changes once each time simulation time increases by 10 nanoseconds, and the externally input value (IN) is switched once every 5 nanoseconds.

Figure 4:
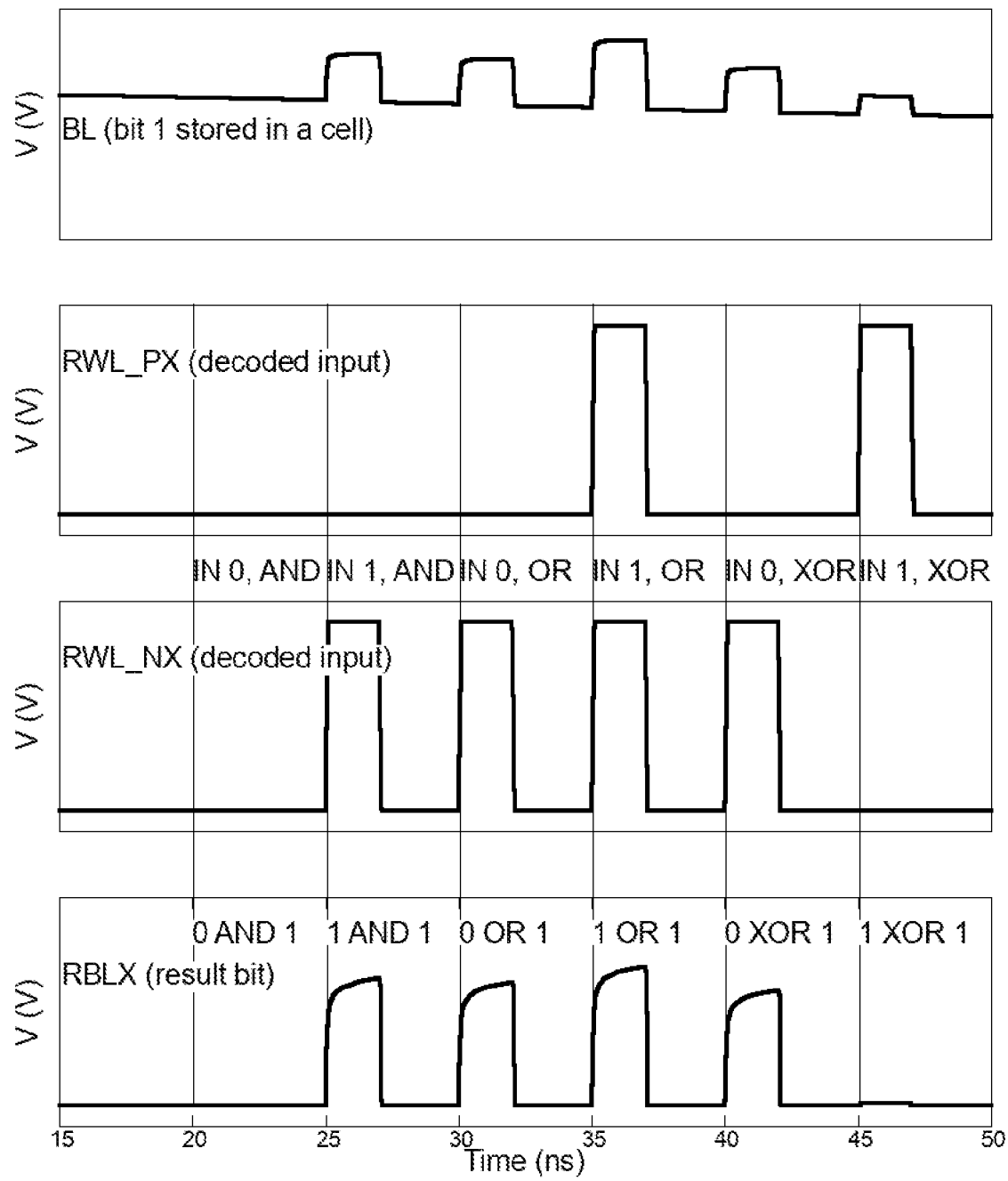
FIG. 4 is a waveform diagram of an operation process based on a SRAM cell and a column-shared reconfigurable Boolean computation cell.
Figure 5:
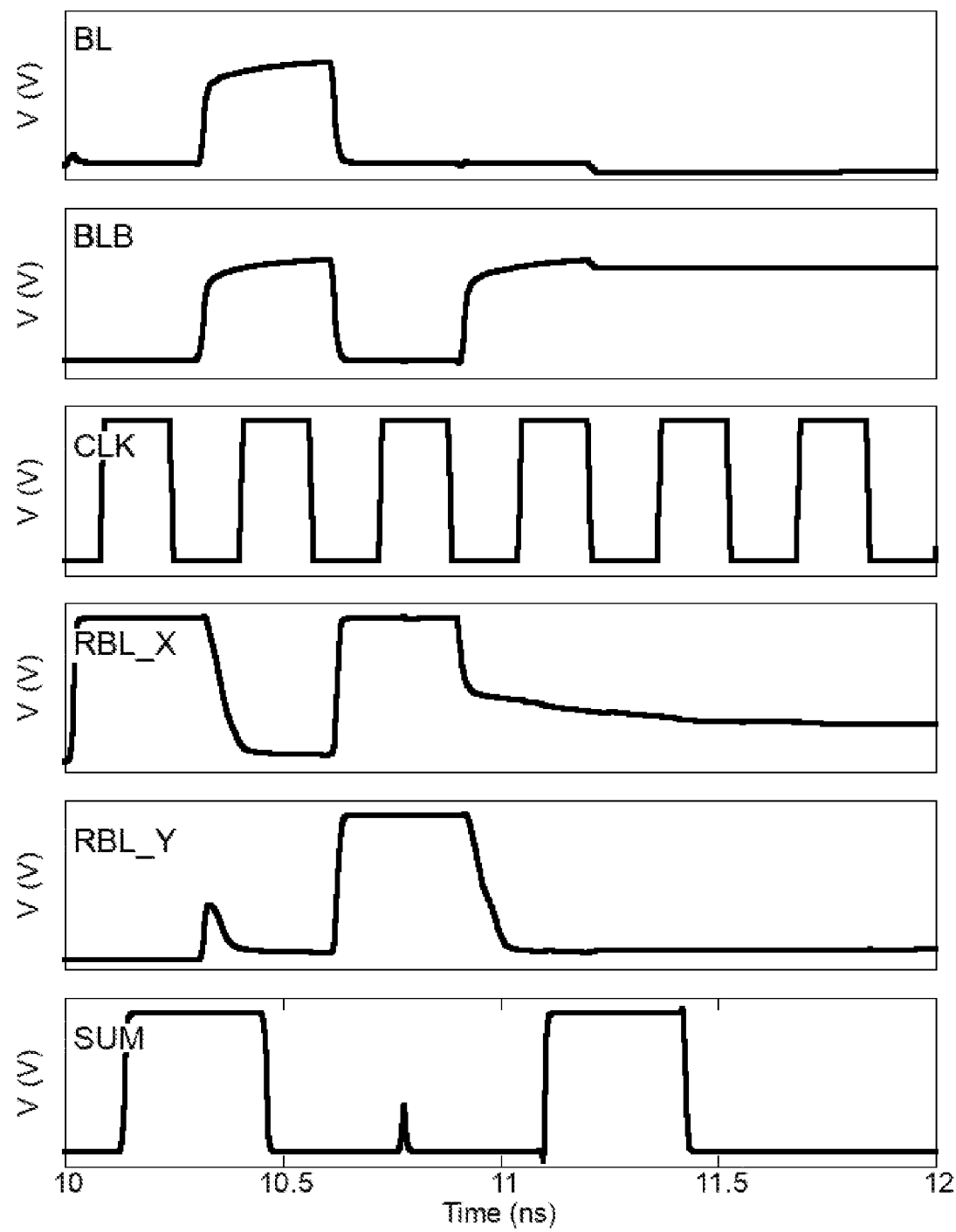
FIG. 5 is a waveform diagram of a 4-bit addition process after a peripheral circuit supporting pipelined bit-parallel addition is used.

For the design of the pipelined bit-serial addition, functional simulation is first conducted under pipeline logic. A netlist is generated through circuit synthesis and tested under Spectre simulation. As shown in FIG. 3, only one column of 6T SRAM cells is displayed, and details have been simplified. A total delay of a peripheral computation circuit (as shown in FIG. 3) is 301 ps. A set of test examples for implementing 4-bit addition is shown in FIG. 5. A number stored in the SRAM array is set to 2 (4'b0010) and an externally input number is set to 7 (4'b0111), to compute a sum. A "sum" wave in a simulation waveform is of a waveform output by a "Sum" port of the peripheral computation circuit bit by bit. A total delay of the 4-bit addition is within 4 clock cycles. A clock frequency during the computation can reach 3.125 GHZ. In addition, a total energy consumption of the 4-bit computation is 0.041 pJ. Similarly, for an n-bit computation, a total computation delay is n cycles. The bit-serial addition scheme has a lower delay than previous work [1]. If this computation mode is activated simultaneously in all columns, an overall data throughput can be improved. In FIG. 4 and FIG. 5, "bit 1 stored in a cell" represents that a value currently stored in the SRAM cell is 1, "decoded input" represents a decoded input, "result bit" represents a result value, "V (V)" represents a voltage (volts), "Time (ns)" represents time (nanoseconds), "IN 0, AND" in the waveform diagram represents that an input is 0 and an AND operation is performed", and others markers have similar meanings.

The embodiments of the present disclosure further provide a cross-layer reconfigurable SRAM based CIM method for edge intelligence, which is applied to a cross-layer reconfigurable SRAM based CIM macro for edge intelligence, and includes following steps:

Reconfiguration step: A reconfiguration computation is performed based on a SRAM cell to obtain a reconfigured structure. On a basis of establishing a SRAM array, CIM supporting pipelined bit-parallel addition is established, and additional computational logic is added to a peripheral circuit of the SRAM array.

Computation step: A column-shared reconfigurable Boolean computation cell outputs a computation result based on the reconfigured structure; and a peripheral computation circuit supporting pipelined bit-serial addition outputs an in-memory addition result on a basis of a Boolean computation.

The SRAM cell separates a WL to obtain a WLX and a WLY. The WLX controls a BL to perform reading and writing on the corresponding SRAM cell. The WLY controls a BLB to perform reading and writing on the corresponding SRAM cell. Voltage levels of an RWL_PX and an RWL_NX depend on a mode of a to-be-performed Boolean computation for the BL and an externally input value, and voltage levels an RWL_PY and an RWL_NY depend on the mode of the to-be-performed Boolean computation for the BLB and the externally input value. The computation result obtained by the column-shared reconfigurable Boolean computation cell is separately output through an RBL_X and an RBL_Y.

If a number currently stored in the array is Q, when the number Q and an externally input number IN need to be added up, a carry value of an $i^{th}$ bit and a sum value of an $(i+1)^{th}$ bit are computed simultaneously; and then a value of $Q_{i+1}$ is read from the BL and a value of $Q_i'$ is read from the bitline bar (BLB), where the $Q_i'$ represents an inverse value of $Q_i$, and the $Q_i$ represents an $i^{th}$ value in a binary expression sequence of the number Q. A column-shared reconfigurable Boolean computation cell connected to the BL performs an XOR computation on a value of the BL and a corresponding decoded external input $IN_i$, and a column-shared reconfigurable Boolean computation cell connected to the BLB uses a value of the BLB and a corresponding decoded external input $IN_{i+1}$ to obtain a Boolean AND result, where the $IN_i$ represents an $i^{th}$ value in a binary expression sequence of the externally input number IN. A Boolean AND result read from the RBL is input into a pipelined addition peripheral computation circuit, and subsequent computational logic is completed.

A CIM method takes n-bit addition as an example, where n-bit means that a binary sequence of each of two operation objects in the addition has n bits. The two operation objects are Q and IN, and their respective binary sequences are $Q_0$, $Q_1$, ..., $Q_n$ and $IN_0$, $IN_1$, ..., $IN_n$.

Step S1: Read the values of the $Q_i$ and the $Q_{i+1}$. In this process, the BL and the BLB are respectively controlled by the WLX and the WLY to charge and discharge. It is allowed to synchronously obtain the value of the $Q_{i+1}$ on the BL and the value of the $Q_i'$ on the BLB.

Step S2: Perform the Boolean computation. The $Q_{i+1}$ on the BL and the $Q_i'$ on the BLB are respectively input into the corresponding column-shared reconfigurable Boolean computation cells, and a computation is separately performed on the $Q_{i+1}$ and the decoded $IN_{i+1}$, and on the $Q_i'$ and the decoded $IN_i$. The XOR computation is performed on the $IN_{i+1}$ and the $Q_{i+1}$, while an AND computation is performed on the $IN_i$ and the $Q_i'$. Two computation results are respectively read from the RBL_X and the RBL_Y.

Step S3: Temporarily store the value read from the RBL_X in a register of the peripheral computation circuit, and combine the value read from the RBL_Y with an intermediate result computed in a previous clock cycle to obtain the carry value of the $i^{th}$ bit, and store the carry value in another register.

Step S4: Enter a next clock cycle, such that the two registers respectively release the carry value of the $i^{th}$ bit and an XOR value of an $(i+1)^{th}$ bit, and a sum value and a carry value of the $(i+1)^{th}$ bit are obtained through a gate circuit operation and are respectively output from Sum and Cnext ports. That is, an existing serial carry adder is divided into two stages, and some of Boolean computations already performed within the SRAM cell are utilized to reduce total time required for the bit-serial addition.

Those skilled in the art are aware that in addition to being realized by using pure computer-readable program code, the system and each apparatus, module, and unit thereof provided in the present disclosure can realize a same function in a form of a logic gate, a switch, an application-specific integrated circuit, a programmable logic controller, or an embedded microcontroller by performing logic programming on the method steps. Therefore, the system and each apparatus, module, and unit thereof provided in the present disclosure can be regarded as a kind of hardware component. The apparatus, module, and unit included therein for realizing each function can also be regarded as a structure in the hardware component; and the apparatus, module, and unit for realizing each function can also be regarded as a software module for implementing the method or a structure in the hardware component.

The specific embodiments of the present disclosure are described above. It should be understood that the present disclosure is not limited to the above specific implementations, and a person skilled in the art can make various variations or modifications within the scope of the claims without affecting the essence of the present disclosure. The embodiments of the present disclosure and features in the embodiments may be arbitrarily combined with each other in a non-conflicting situation.

What is claimed is:

1. A cross-layer reconfigurable static random access memory (SRAM) based compute-in-memory (CIM) macro for edge intelligence, comprising a SRAM cell and a column-shared reconfigurable Boolean computation cell, and configured to
  perform a reconfiguration computation based on the SRAM cell to obtain a reconfigured structure; and
  output, by the column-shared reconfigurable Boolean computation cell, a computation result based on the reconfigured structure, wherein
  the SRAM cell has a plurality of transistors and separates a wordline (WL) to obtain a wordline X (WLX) and a wordline Y (WLY);
  the WLX controls a bitline (BL) to perform reading and writing on the corresponding SRAM cell;
  the WLY controls a bitline bar (BLB) to perform reading and writing on the corresponding SRAM cell;
  a plurality of additional transistors connected to a BL and a BLB in each column are column-shared reconfigurable Boolean computation cells;
  voltage levels of a read wordline PX (RWL_PX) and a read wordline NX (RWL_NX) depend on a mode of a to-be-performed Boolean computation for the BL and an externally input value;
  voltage levels of a read wordline PY (RWL_PY) and a read wordline NY (RWL_NY) depend on the mode of the to-be-performed Boolean computation for the BLB and the externally input value; and
  the computation result obtained by the column-shared reconfigurable Boolean computation cell is separately output through a read bitline X (RBL_X) and a read bitline Y (RBL_Y).

2. The cross-layer reconfigurable SRAM based CIM macro for edge intelligence according to claim 1, wherein the column-shared reconfigurable Boolean computation cell supports read, write, AND, OR, and XOR modes; and
  the column-shared reconfigurable Boolean computation cell is configured by a value of decoded input data and a specific computing mode coming along with RWLs, and computed results are generated in RBLs.

3. The cross-layer reconfigurable SRAM based CIM macro for edge intelligence according to claim 1, wherein on a basis of establishing a SRAM array, CIM supporting pipelined bit-serial addition is established; and
  in a CIM establishment process, additional computational logic is added to a peripheral circuit of the SRAM array.

4. The cross-layer reconfigurable SRAM based CIM macro for edge intelligence according to claim 3, wherein if a number currently stored in the array is Q, when the number Q and an externally input number IN need to be added up, a carry value of an $i^{th}$ bit and a sum value of an $(i+1)^{th}$ bit are computed simultaneously; and then a value of $Q_{i+1}$ is read from the BL and a value of $Q_i'$ is read from the BLB, wherein the $Q_i'$ represents an inverse value of $Q_i$, and the $Q_i$ represents an $i^{th}$ value in a binary expression sequence of the number Q;
  a column-shared reconfigurable Boolean computation cell connected to the BL performs an XOR computation on a value of the BL and a corresponding decoded external input $IN_i$, and a column-shared reconfigurable Boolean computation cell connected to the BLB uses a value of the BLB and a corresponding decoded external input $IN_{i+1}$ to obtain a Boolean AND result, wherein the $IN_i$ represents an $i^{th}$ value in a binary expression sequence of the externally input number IN; and
  a Boolean AND result read from an RBL is input into a pipelined addition peripheral computation circuit, and subsequent computational logic is completed.

5. The cross-layer reconfigurable SRAM based CIM macro for edge intelligence according to claim 3, wherein a multiply accumulate (MAC) operation is established on pipelined bit-parallel addition;
  an input and a weight of each layer of a neural network are stored in a slice of the SRAM array in different ways;
  each array has limited storage space and is adjusted based on precision and kernel size requirements during linking; and
  in a MAC operation process, a logic part of the pipelined bit-parallel addition in the peripheral circuit is reused for a shift-and-add multiplication algorithm.

6. A cross-layer reconfigurable SRAM based CIM method for edge intelligence, applied to the cross-layer reconfigurable SRAM based CIM macro for edge intelligence according to claim 1, and comprising following steps:

reconfiguration step: performing a reconfiguration computation based on a SRAM cell to obtain a reconfigured structure; and computation step: outputting, by a column-shared reconfigurable Boolean computation cell, a computation result based on the reconfigured structure, wherein the SRAM cell has a plurality of transistors and separates a wordline (WL) to obtain a wordline X (WLX) and a wordline Y (WLY);

the WLX controls a bitline (BL) to perform reading and writing on the corresponding SRAM cell;

the WLY controls a bitline bar (BLB) to perform reading and writing on the corresponding SRAM cell;

a plurality of additional transistors connected to a BL and a BLB in each column are column-shared reconfigurable Boolean computation cells;

voltage levels of a read wordline PX (RWL_PX) and a read wordline NX (RWL_NX) depend on a mode of a to-be-performed Boolean computation for the BL and an externally input value;

voltage levels of a read wordline PY (RWL_PY) and a read wordline NY (RWL_NY) depend on the mode of the to-be-performed Boolean computation for the BLB and the externally input value; and the computation result obtained by the column-shared reconfigurable Boolean computation cell is separately output through a read bitline X (RBL_X) and a read bitline Y (RBL_Y).

7. The cross-layer reconfigurable SRAM based CIM method for edge intelligence according to claim 6, wherein the column-shared reconfigurable Boolean computation cell supports read, write, AND, OR, and XOR modes; and the column-shared reconfigurable Boolean computation cell is configured by a value of decoded input data and a specific computing mode coming along with RWLs, and computed results are generated in RBLs.

8. The cross-layer reconfigurable SRAM based CIM method for edge intelligence according to claim 6, wherein on a basis of establishing a SRAM array, CIM supporting pipelined bit-serial addition is established; and in a CIM establishment process, additional computational logic is added to a peripheral circuit of the SRAM array.

9. The cross-layer reconfigurable SRAM based CIM method for edge intelligence according to claim 8, wherein if a number currently stored in the array is Q, when the number Q and an externally input number IN need to be added up, a carry value of an $i^{th}$ bit and a sum value of an $(i+1)^{th}$ bit are computed simultaneously; and then a value of $Q_{i+1}$ is read from the BL and a value of $Q_i'$ is read from the BLB, wherein the $Q_i'$ represents an inverse value of $Q_i$, and the $Q_i$ represents an $i^{th}$ value in a binary expression sequence of the number Q;

a column-shared reconfigurable Boolean computation cell connected to the BL performs an XOR computation on a value of the BL and a corresponding decoded external input $IN_i$, and a column-shared reconfigurable Boolean computation cell connected to the BLB uses a value of the BLB and a corresponding decoded external input $IN_{i+1}$ to obtain a Boolean AND result, wherein the $IN_i$ represents an $i^{th}$ value in a binary expression sequence of the externally input number IN; and a Boolean AND result read from an RBL is input into a pipelined addition peripheral computation circuit, and subsequent computational logic is completed.

10. The cross-layer reconfigurable SRAM based CIM method for edge intelligence according to claim 8, wherein a multiply accumulate (MAC) operation is established on pipelined bit-parallel addition;

an input and a weight of each layer of a neural network are stored in a slice of the SRAM array in different ways;

each array has limited storage space and is adjusted based on precision and kernel size requirements during linking; and in a MAC operation process, a logic part of the pipelined bit-parallel addition in the peripheral circuit is reused for a shift-and-add multiplication algorithm.

11. The cross-layer reconfigurable SRAM based CIM method for edge intelligence according to claim 6, wherein in the computation step, the SRAM cell separates a WL to obtain a WLX and a WLY;

the WLX controls a BL to perform reading and writing on the corresponding SRAM cell;

the WLY controls a BLB to perform reading and writing on the corresponding SRAM cell;

voltage levels of an RWL_PX and an RWL_NX depend on a mode of a to-be-performed Boolean computation for the BL and an externally input value;

voltage levels of an RWL_PY and an RWL_NY depend on the mode of the to-be-performed Boolean computation for the BLB and the externally input value; and the computation result obtained by the column-shared reconfigurable Boolean computation cell is separately output through an RBL_X and an RBL_Y.

12. The cross-layer reconfigurable SRAM based CIM method for edge intelligence according to claim 7, wherein in the computation step, the SRAM cell separates a WL to obtain a WLX and a WLY;

the WLX controls a BL to perform reading and writing on the corresponding SRAM cell;

the WLY controls a BLB to perform reading and writing on the corresponding SRAM cell;

voltage levels of an RWL_PX and an RWL_NX depend on a mode of a to-be-performed Boolean computation for the BL and an externally input value;

voltage levels of an RWL_PY and an RWL_NY depend on the mode of the to-be-performed Boolean computation for the BLB and the externally input value; and the computation result obtained by the column-shared reconfigurable Boolean computation cell is separately output through an RBL_X and an RBL_Y.

13. The cross-layer reconfigurable SRAM based CIM method for edge intelligence according to claim 8, wherein in the computation step, the SRAM cell separates a WL to obtain a WLX and a WLY;

the WLX controls a BL to perform reading and writing on the corresponding SRAM cell;

the WLY controls a BLB to perform reading and writing on the corresponding SRAM cell;

voltage levels of an RWL_PX and an RWL_NX depend on a mode of a to-be-performed Boolean computation for the BL and an externally input value;

voltage levels of an RWL_PY and an RWL_NY depend on the mode of the to-be-performed Boolean computation for the BLB and the externally input value; and the computation result obtained by the column-shared reconfigurable Boolean computation cell is separately output through an RBL_X and an RBL_Y.

14. The cross-layer reconfigurable SRAM based CIM method for edge intelligence according to claim 9, wherein in the computation step, the SRAM cell separates a WL to obtain a WLX and a WLY;

the WLX controls a BL to perform reading and writing on the corresponding SRAM cell;

the WLY controls a BLB to perform reading and writing on the corresponding SRAM cell;

voltage levels of an RWL_PX and an RWL_NX depend on a mode of a to-be-performed Boolean computation for the BL and an externally input value;

voltage levels of an RWL_PY and an RWL_NY depend on the mode of the to-be-performed Boolean computation for the BLB and the externally input value; and the computation result obtained by the column-shared reconfigurable Boolean computation cell is separately output through an RBL_X and an RBL_Y.

15. The cross-layer reconfigurable SRAM based CIM method for edge intelligence according to claim 10, wherein in the computation step, the SRAM cell separates a WL to obtain a WLX and a WLY;

the WLX controls a BL to perform reading and writing on the corresponding SRAM cell;

the WLY controls a BLB to perform reading and writing on the corresponding SRAM cell;

voltage levels of an RWL_PX and an RWL_NX depend on a mode of a to-be-performed Boolean computation for the BL and an externally input value;

voltage levels of an RWL_PY and an RWL_NY depend on the mode of the to-be-performed Boolean computation for the BLB and the externally input value; and the computation result obtained by the column-shared reconfigurable Boolean computation cell is separately output through an RBL_X and an RBL_Y.

16. The cross-layer reconfigurable SRAM based CIM method for edge intelligence according to claim 6, wherein in the reconfiguration step, on a basis of establishing a SRAM array, CIM supporting pipelined bit-serial addition is established, and additional computational logic is added to a peripheral circuit of the SRAM array.

17. The cross-layer reconfigurable SRAM based CIM method for edge intelligence according to claim 16, wherein in the computation step, if a number currently stored in the array is Q, when the number Q and an externally input number IN need to be added up, a carry value of an $i^{th}$ bit and a sum value of an $(i+1)^{th}$ bit are computed simultaneously; and then a value of $Q_{i+1}$ is read from the BL and a value of $Q_i'$ is read from the BLB, wherein the $Q_i'$ represents an inverse value of $Q_i$, and the $Q_i$ represents an $i^{th}$ value in a binary expression sequence of the number Q;

a column-shared reconfigurable Boolean computation cell connected to the BL performs an XOR computation on a value of the BL and a corresponding decoded external input $IN_i$, and a column-shared reconfigurable Boolean computation cell connected to the BLB uses a value of the BLB and a corresponding decoded external input $IN_{i+1}$ to obtain a Boolean AND result, wherein the $IN_i$ represents an $i^{th}$ value in a binary expression sequence of the externally input number IN; and a Boolean AND result read from an RBL is input into a pipelined addition peripheral computation circuit, and subsequent computational logic is completed.

18. A cross-layer reconfigurable SRAM based CIM method for edge intelligence, applied to the cross-layer reconfigurable SRAM based CIM macro for edge intelligence according to claim 1, and comprising following steps:

reconfiguration step: performing a reconfiguration computation based on a SRAM cell to obtain a reconfigured structure; and computation step: outputting, by a column-shared reconfigurable Boolean computation cell, a computation result based on the reconfigured structure, wherein in the computation step, the SRAM cell separates a WL to obtain a WLX and a WLY;

the WLX controls a BL to perform reading and writing on the corresponding SRAM cell;

the WLY controls a BLB to perform reading and writing on the corresponding SRAM cell;

voltage levels of an RWL_PX and an RWL_NX depend on a mode of a to-be-performed Boolean computation for the BL and an externally input value;

voltage levels of an RWL_PY and an RWL_NY depend on the mode of the to-be-performed Boolean computation for the BLB and the externally input value; and the computation result obtained by the column-shared reconfigurable Boolean computation cell is separately output through an RBL_X and an RBL_Y.

19. A cross-layer reconfigurable SRAM based CIM method for edge intelligence, applied to the cross-layer reconfigurable SRAM based CIM macro for edge intelligence according to claim 1, and comprising following steps:

reconfiguration step: performing a reconfiguration computation based on a SRAM cell to obtain a reconfigured structure; and computation step: outputting, by a column-shared reconfigurable Boolean computation cell, a computation result based on the reconfigured structure, wherein in the reconfiguration step, on a basis of establishing a SRAM array, CIM supporting pipelined bit-serial addition is established, and additional computational logic is added to a peripheral circuit of the SRAM array.

20. The cross-layer reconfigurable SRAM based CIM method for edge intelligence according to claim 19, wherein in the computation step, if a number currently stored in the array is Q, when the number Q and an externally input number IN need to be added up, a carry value of an $i^{th}$ bit and a sum value of an $(i+1)^{th}$ bit are computed simultaneously; and then a value of $Q_{i+1}$ is read from the BL and a value of $Q_i'$ is read from the BLB, wherein the $Q_i'$ represents an inverse value of $Q_i$, and the $Q_i$ represents an $i^{th}$ value in a binary expression sequence of the number Q;

a column-shared reconfigurable Boolean computation cell connected to the BL performs an XOR computation on a value of the BL and a corresponding decoded external input $IN_i$, and a column-shared reconfigurable Boolean computation cell connected to the BLB uses a value of the BLB and a corresponding decoded external input $IN_{i+1}$ to obtain a Boolean AND result, wherein the $IN_i$ represents an $i^{th}$ value in a binary expression sequence of the externally input number IN; and a Boolean AND result read from an RBL is input into a pipelined addition peripheral computation circuit, and subsequent computational logic is completed.

* * * * *